(12) United States Patent
Bowen

(10) Patent No.: US 8,847,923 B1
(45) Date of Patent: Sep. 30, 2014

(54) KEYBOARD WITH REFLECTED LIGHT BEAM FINGER DETECTION

(71) Applicant: James Harrison Bowen, Elizabeth City, NC (US)

(72) Inventor: James Harrison Bowen, Elizabeth City, NC (US)

( * ) Notice: Subject to any disclaimer, the term of this patent is extended or adjusted under 35 U.S.C. 154(b) by 0 days.

(21) Appl. No.: 14/098,926

(22) Filed: Dec. 6, 2013

Related U.S. Application Data

(63) Continuation-in-part of application No. 13/183,605, filed on Jul. 15, 2011.

(51) Int. Cl.
*G06F 3/042* (2006.01)
*G06F 3/02* (2006.01)

(52) U.S. Cl.
CPC ........................................ *G06F 3/02* (2013.01)
USPC ........................................... 345/175; 345/168

(58) Field of Classification Search
None
See application file for complete search history.

(56) References Cited

U.S. PATENT DOCUMENTS

| | | |
|---|---|---|
| 4,629,884 A | 12/1986 | Bergstrom |
| 4,701,747 A | 10/1987 | Isherwood et al. |
| 5,378,069 A | 1/1995 | Bowen |
| 5,577,848 A | 11/1996 | Bowen |
| 5,605,406 A | 2/1997 | Bowen |
| 5,707,160 A | 1/1998 | Bowen |
| 5,785,439 A | 7/1998 | Bowen |
| 6,175,679 B1 | 1/2001 | Veligdan et al. |
| 2006/0139185 A1* | 6/2006 | Bonnat et al. .................. 341/21 |
| 2008/0055494 A1* | 3/2008 | Cernasov ........................ 349/12 |
| 2011/0169743 A1* | 7/2011 | Oh et al. ....................... 345/169 |
| 2012/0056846 A1* | 3/2012 | Zaliva .......................... 345/174 |

* cited by examiner

*Primary Examiner* — Christopher R Lamb
(74) *Attorney, Agent, or Firm* — Whitham Curtis Christofferson & Cook, PC

(57) ABSTRACT

A keyboard where a light beam is reflected off a finger to detect a keyboard key location sent to a PC or other device that can be used in bright sunlight and total darkness. The keyboard has a planar top surface with no openings or bacteria harbors.

4 Claims, 10 Drawing Sheets

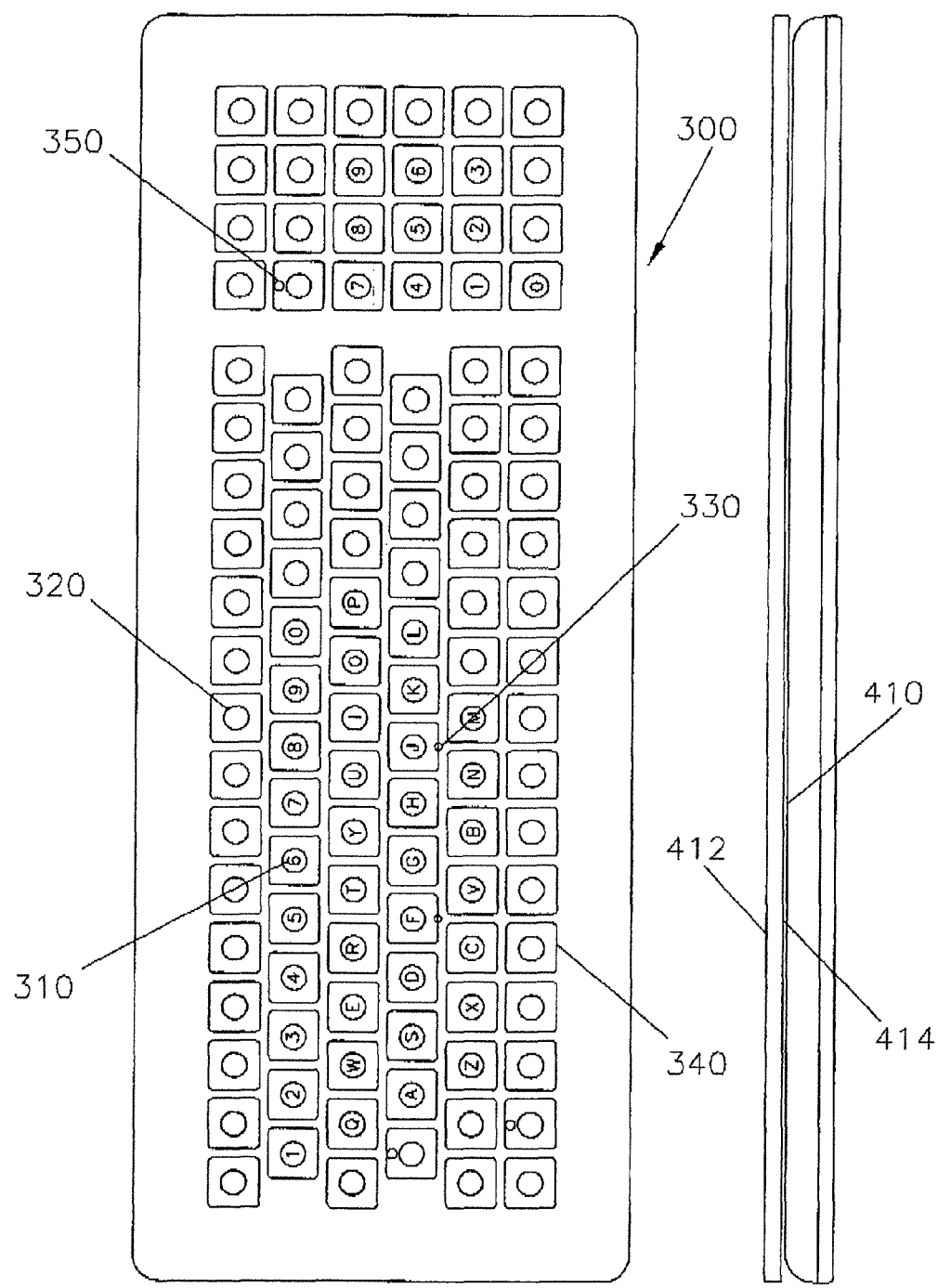
*FIG. 3*     *FIG. 4*

KEYBOARD WITH REFLECTED LIGHT BEAM FINGER DETECTION

CROSS-REFERENCES TO RELATED APPLICATION

This application is a continuation-in-part (CIP)application of the patent application having U.S. Ser. No. 13/183,605 filed on Jul. 15, 2011. The complete contents of the above-identified patent application being herein incorporated by reference.

BACKGROUND OF THE INVENTION

1. Field of the Invention

The present invention generally relates to a standalone input device or keyboard with a planar top surface with no openings or cracks to a personal computer (PC), control panels for operating equipment, and data input in rugged environments where an internal light beam is emitted out through an optical opening into bright sunlight ambient or total darkness, when a finger is present the finger encompasses the opening blocking out the ambient influence on a detector, the emitter is turned on reflecting the emitted unabated beam off the finger to a detector indicating a finger is present.

2. Description of the Prior Art

Optical keyboards some use techniques to reduce the ambient effect on finger detection but when used in bright sunlight where bright sunlight saturates the photodiodes nothing stops this saturation unless under an awning or the like, and in total darkness where the user cannot see the key indicia, or lack a planer top surface to be easily cleaned in industrial, atomic and medical environments, some of which that try follow hereto.

U.S. Pat. No. 6,175,679 Veligdan et al shows a keyboard with stacked waveguides to detect a finger.

U.S. Pat. No. 4,629,884 Bergstom with a radiation propagating prism to detect a finger.

U.S. Pat. No. 4,701,747 Isterwood shows a keyboard that has a light beam from a LED that reflects the light beam to a photodiode when a finger is present with a noise and ambient electronic rejection technique.

U.S. Pat. Nos. 5,378,069, 5,577,848, 5,605,406, 5,707,160, 5,785,439, Bowen shows keyboards that detects an users finger by blocking an X and Y optical beam.

SUMMARY OF THE INVENTION

The invention being a keyboard where a light beam is reflected off a finger to detect a keyboard key location and can be used in bright sunlight and total darkness with no openings or cracks in the keyboard top surface to harbor bacteria.

It is therefor the primary objective of this invention in environments where an internal light beam is emitted out through a opening into an ambient where in high ambient when a finger is present the finger encompasses the opening blocking out the ambient influence on a detector and reflecting the unabated beam from the finger to a detector indicating a finger is present. This small opening is about the size of the finger print area of a users finger, or about ten mm in diameter.

A further object of the invention is to have a LED of different wave length to the finger detection emitter and photo detection diode to emit a visible light beam to show the key indicia in dark environments to direct the user to a key location.

A further object of this invention is to have keyboard top surface to be a planar one piece top surface with no opening or cracks, for atomic contaminates, medical contaminates or fluids or other contaminates that cannot be easily cleaned, this is very advantageous because the size of nuclear molecules are so small even the smallest crack or even a decal on the top surface can harbor nuclear contaminates or bacteria.

A further object of this invention is to have calibration where the dark count from the photo detector is stored and finger detection scanning is not started until this calibration level or derivative thereof is reached.

A further object of this invention is to detect changing ambient light to automatically change the output intensity of the key indicia LED output so the key indicia is always readable by the user.

A further object of this invention to have the threshold of the photo detector variable to ambient changing lighting to scan for a finger prior reaching the calibration level.

A further object of the invention is to have no finger detection moving parts facilitating long operational life.

BRIEF DESCRIPTION OF THE DRAWINGS

The foregoing and other objects, aspects and advantages will be better understood from the following detailed description of the invention with reference to the drawings, in which:

FIG. 3 shows a top view of a keyboard with a plastic housing with a plurality of key location openings for light beam finger detection in accordance with the teachings of this invention;

FIG. 4 shows a front view of the keyboard in FIG. 3 in accordance with the teachings of this invention;

DETAILED DESCRIPTION OF THE INVENTION

Figure 1:
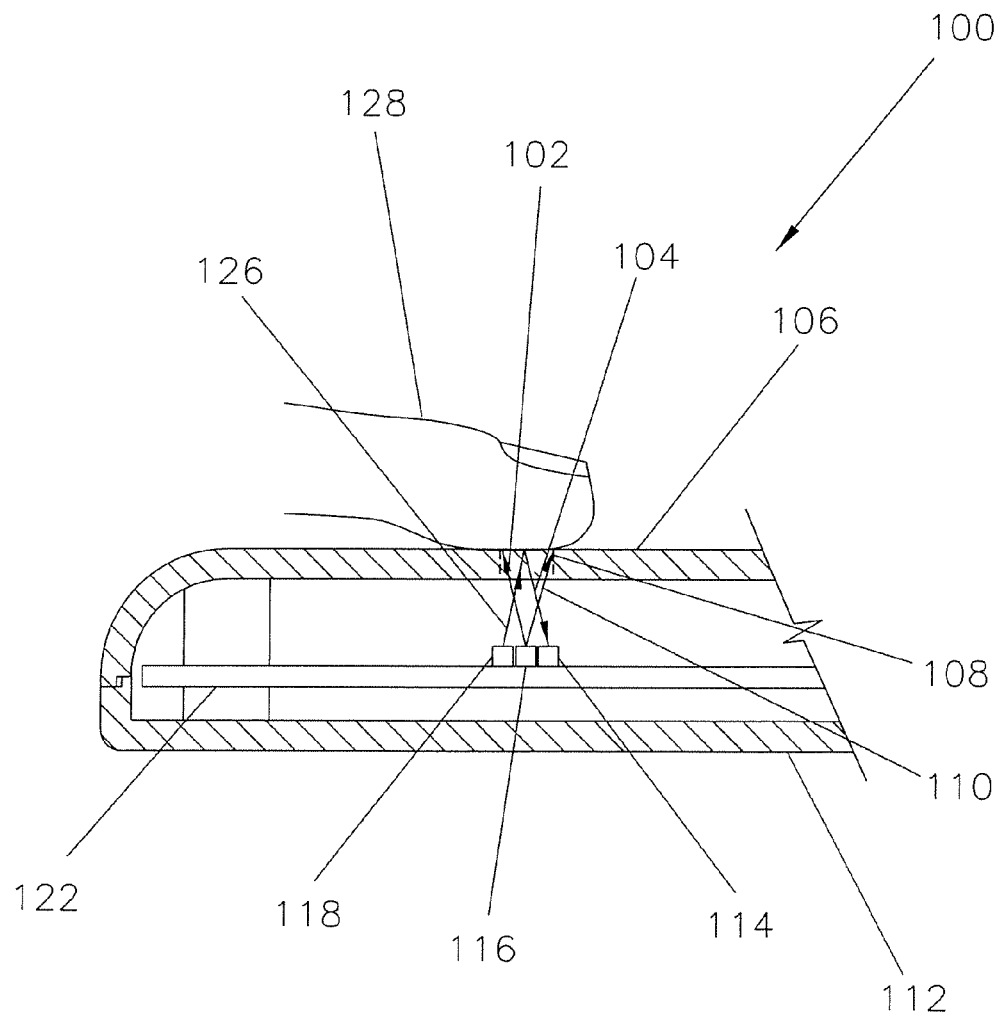
FIG. 1 shows a finger placed on a key location with printed or molded key indicia of a keyboard with one piece plastic top housing having an emitted light beam reflected off a finger to a detector when a finger is present in accordance with the teachings of this invention.

Referring now to the drawings, FIG. 1 shows a keyboard 100 with a one piece planar top cover 106 forming the upper housing of keyboard 100 with an operators finger 128 placed over an opening 108 to block ambient light from influencing the output of emitter 118 and reflecting the output beam 126 to photo detector 114 via reflected beam 104. Center LED emitter 116 outputs a beam shown by arrows 110 and 102 to illuminate the key indicia printed on top cover 106 so a user in low light ambient can see key indicia. Lower housing 112 covers printed wiring board 122 that provide connection circuitry for emitter 118, photo detector 114 and LED emitter 116. Output emitter 118 and detector 114 are generally of the 800 to 950 wave length in the inferred (IR) region and LED emitter 116 is in the visible wave length for the colors that a user may specify for there preference maybe red, yellow, green or other color. Opening 108 is shown dotted to show it is only an optical opening area that could be formed from a printed ink surround and is not a physical opening or hole, it is just an area. Top cover 106 is generally thought of as a substantially thin transparent or some degree of translucency in nature but could be of a IR transparent material and reduced in thickness at opening 108 location to allow visible emittance from LED emitter 116 to show or highlight key indicia. Having a one piece top cover 106 is very advantageous because the size of nuclear molecules are so small even the smallest crack can hide nuclear contaminates, and as with medical molecules there can be no crack or holes because when cleaning with cleaners that kill bacteria, even though the bacteria is dead it is still there in the crack or hole.

Figure 1A:
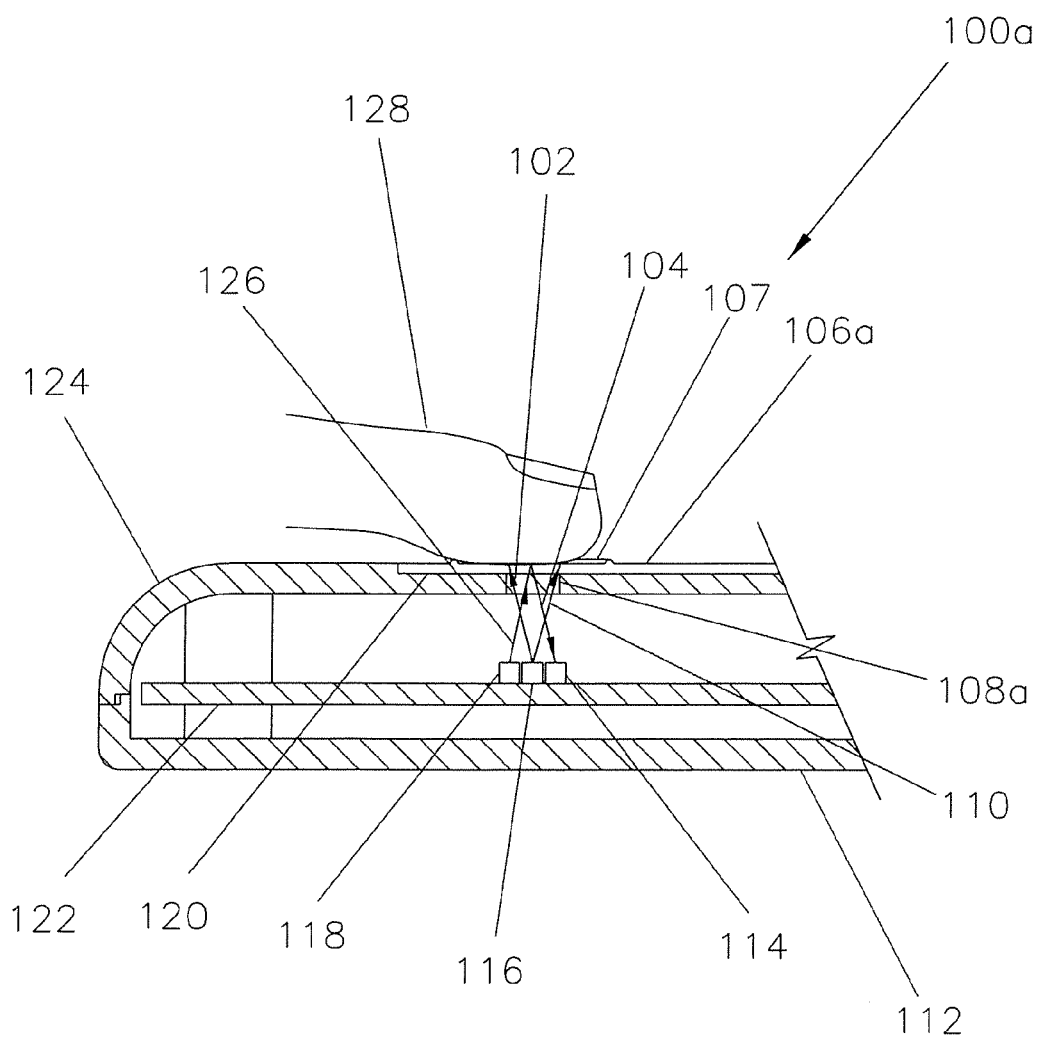
FIG. 1A shows a finger placed on a key location of a keyboard with plastic top housing with an insert with key indicia printed or molded having an emitted light beam reflected off a finger to a detector when a finger is present in accordance with the teachings of this invention.

FIG. 1A is of similar structure of FIG. 1 with like item numbers being the same in both FIG'S, keyboard 100a is shown with key indicia insert 106a has printed or molded key locational text is located in indicia recess 120 and allows top cover 124 to be of a clear material or of an opaque material with hole 108a to allow emitted beams to reflect off the finger or the relationship of the finger touching key indicia insert 106a. Hole 108a would not be needed in top cover 124 if the material of top cover 124 is clear, transparent, or translucent. Embossed square 107 giving tactile locational feel for a users finger 128 is a very slightly raised square and could be only one to five mils high that protrudes up from planar surface of key insert 106a or could be molded into the keyboard in FIG. 1 keyboard 100 top surface and made small enough as not to hold or harbor bacteria or other molecular contaminants, these areas are not needed for most users but can be added for a user preference when needed.

Figure 2:
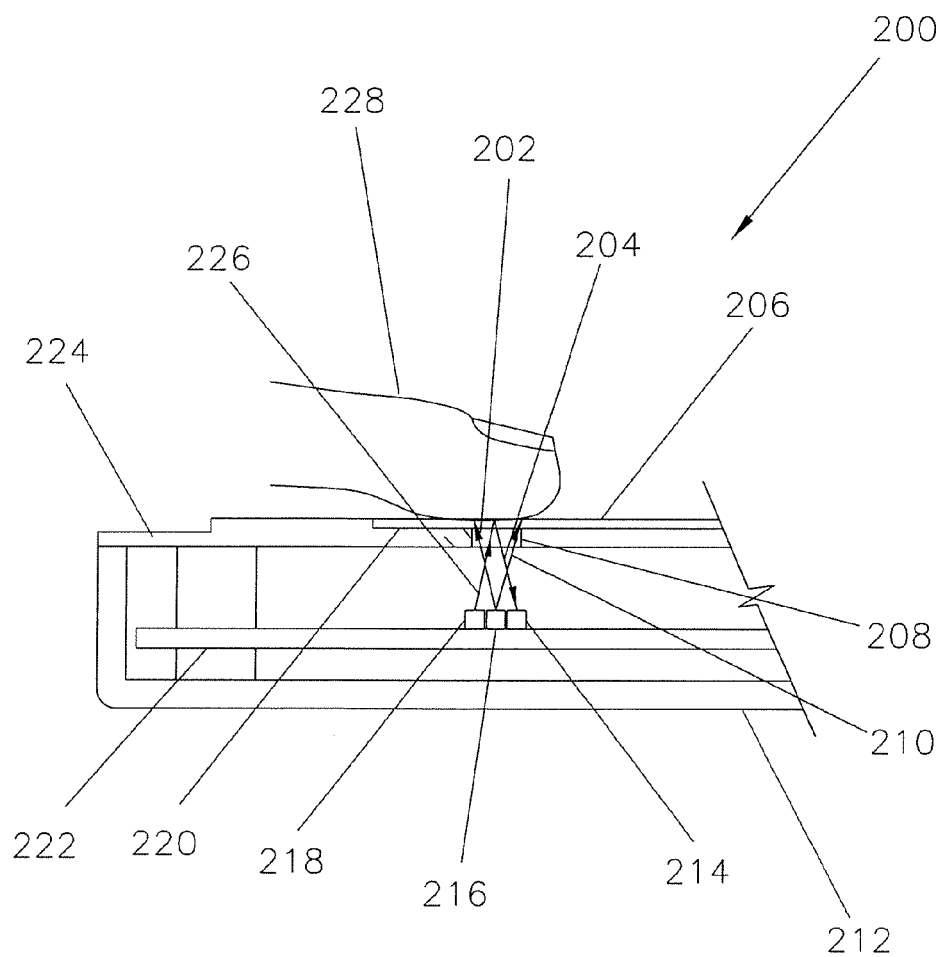
FIG. 2 shows a finger placed on a key location of a keyboard with a metal housing having an emitted light beam reflected off a finger to a detector when a finger is present in accordance with the teachings of this invention.

FIG. 2 shows a keyboard 200 with a top cover 206 forming the upper housing of keyboard 200 with an operators finger 228 placed over an opening 208 to block ambient light from influencing the output of emitter 118 and reflecting the output beam 226 to photo detector 214 via reflected beam 204. It is not always necessary to block all the ambient from getting to photo detector 214, if the keyboard is used in areas where there is no bright sunlight then opening 208 can be larger and let the digital signal processing (DSP) of the microprocessor 600 of FIG. 6 differentiate the attenuation of the finger as it influences photo detector 214 to detect a finger. Center LED emitter 216 outputs a beam shown by arrows 210 and 202 to illuminate the key indicia printed on an insert in recess 220 of top cover 206 so a user in low light ambient can see key indicia. Lower housing 212 covers printed wiring board 222 that provide connection circuitry for emitter 218, photo detector 214 and LED emitter 216. Output emitter 218 and detector 214 are generally of the 800 to 950 wave length in the IR region and LED emitter 216 is in the visible wave length for the colors that a user may specify for there preference maybe red, yellow, green or other color. Opening 208 is shown to show it can be only an optical opening that could be formed from a printed ink surround and not a physical opening or hole depending on the material of top cover 206. If top cover 206 is molded of a plastic like material opening 208 could be only of some degree of transparent or translucent and if top cover 206 is machined from metal or a plastic like material being opaque opening 208 can be a physical hole. Mounting recess 224 facilitates mounting keyboard 200 into another panel or the like or machine.

FIG. 3 shows a top view of keyboard 300 with a plastic housing and a plurality of key location openings 320 for light beam finger detection of key indicia 310. Tactile raised area 330 at the base of the J indicia and the F indicia allows for finger detection to relate the index fingers of the left and ring hand to the key pattern, and key raised areas 340 also give finger tactile location to feel for keys and could be as small as one to five mils in height, these areas are not needed for most users but can be added for a user preference when needed.

FIG. 4 shows a front view of keyboard 300 of FIG. 3 with a planar top surface 410.

Figure 5:
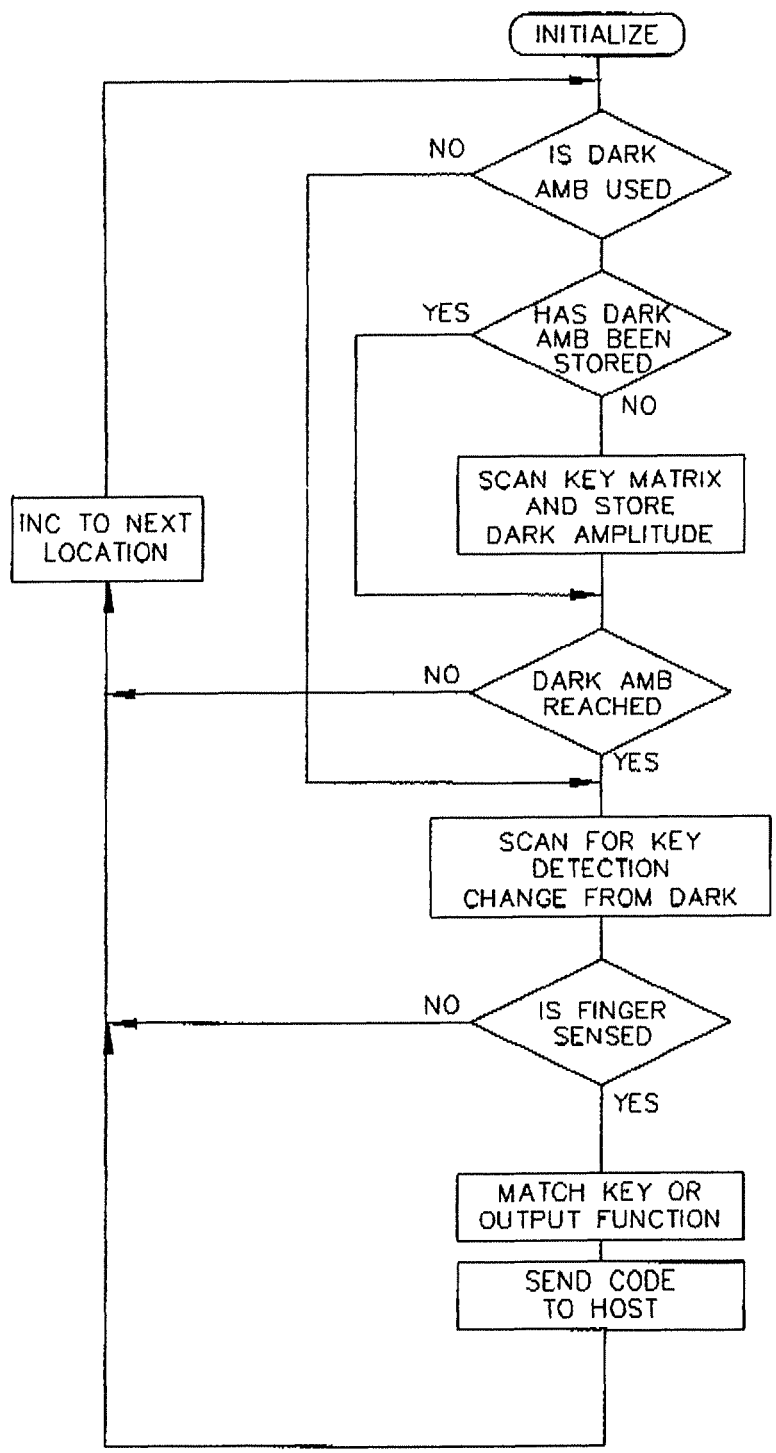
FIG. 5 is a flow chart showing the program in the microprocessor for controlling the keyboard in accordance with the teachings of this invention.

FIG. 5 is a flow chart showing the program in the microprocessor for controlling the keyboard where at INITIALIZE the processor starts and sets all of the output and input ports to their status and sends start up codes to a host for PS2 or USB, or if connected to a serial host then awaits instructions to start keyboard functions, or continues with PS2 or USB outputs. At IS DARK AMB USED if the keyboard is not going to be used in a dark ambient environment or in bright sunlight then goes on to SCAN FOR KEY DETECTION, if dark ambient is being used a question HAS DARK AMB BEEN STORED is ask and if needed goes to NO and does SCAN KEY MATRIX AND STORE DARK AMPLITUDE, and then goes to is DARK AMB REACHED meaning if a users finger has been placed over a key indicia location and blocked the ambient light from the detectors the amplitude of the detectors would of reached the dark ambient stored threshold and at YES the scan of the key location would start at SCAN FOR KEY DETECTION CHANGE FROM DARK and the IR emitter would be turned on to see if a reflectance was seen on the IR detector, then go to IS FINGER SENSED and if a reflectance is seen then YES and go to MATCH KEY OR OUTPUT FUNCTION and SEND CODE TO HOST and INC TO NEXT LOCATION and return, or if at IS FINGER SENSED a reflectance is not seen then INC TO NEXT LOCATION and return. If at SCAN FOR KEY DETECTION where the resulting from a NO at IS DARK AMB USED the IR emitter is turned on to see if a reflectance, as shown at the detector as an attenuation of diode output, is seen and tested at IS FINGER SENCED is YES then go to MATCH KEY OR OUTPUT FUNCTION and SEND CODE TO HOST and INC TO NEXT LOCATION and return, or if at IS FINGER SENSED a reflectance, as shown at the detector as an attenuation of diode output, is not seen then INC TO NEXT LOCATION and return. This process is continued until all keys on the keyboard are tested and then the process is started again. It should be understood by those skilled in the art that the keyboard could be any number of keys and not only the amount of keys shown in FIG. 3.

Figure 6:
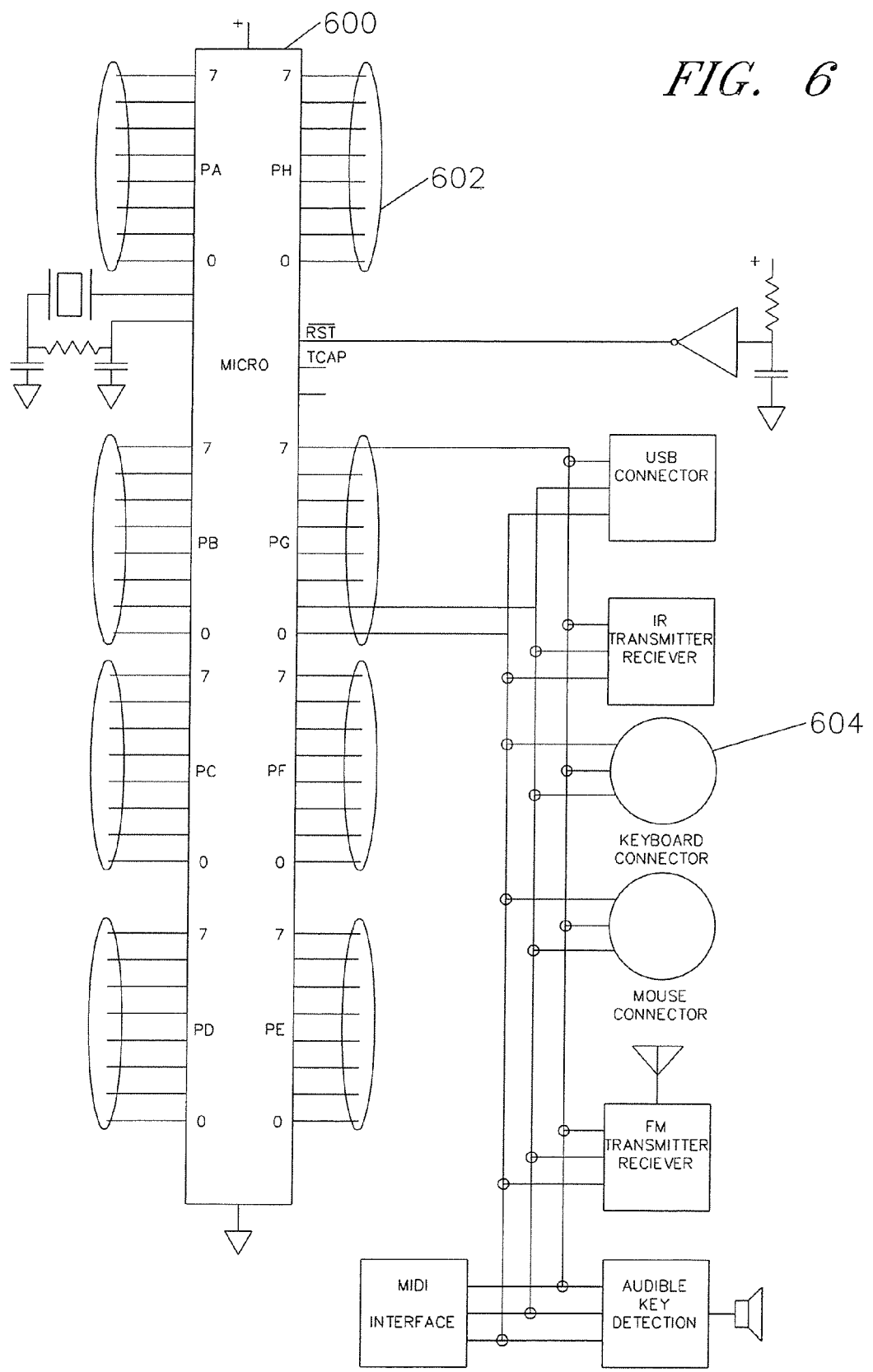
FIG. 6 is a schematic illustrating the microprocessor section of the keyboard in accordance with the teachings of this invention.
Figure 7:
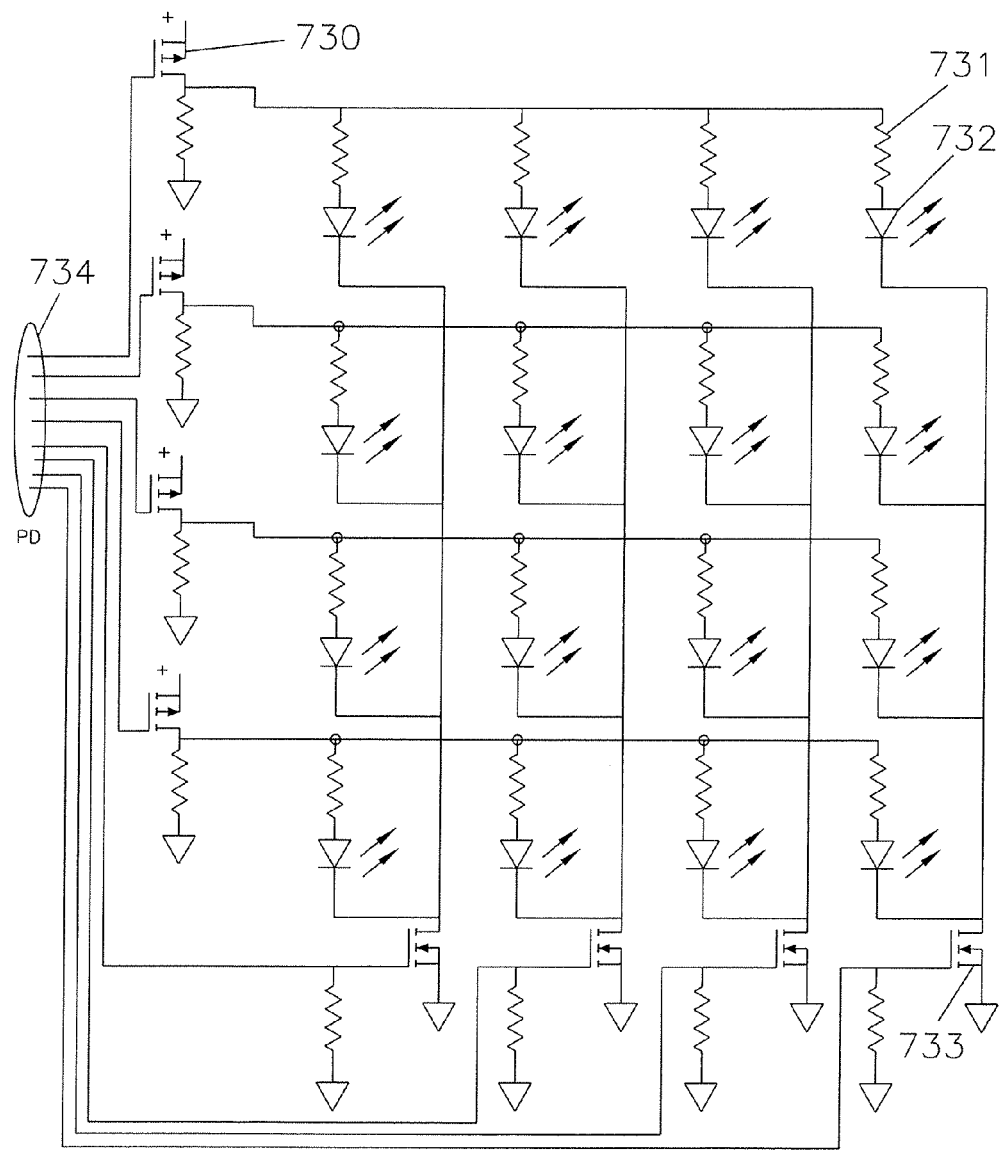
FIG. 7 is a schematic illustrating the emitter output section of the keyboard in accordance with the teachings of this invention.
Figure 8:
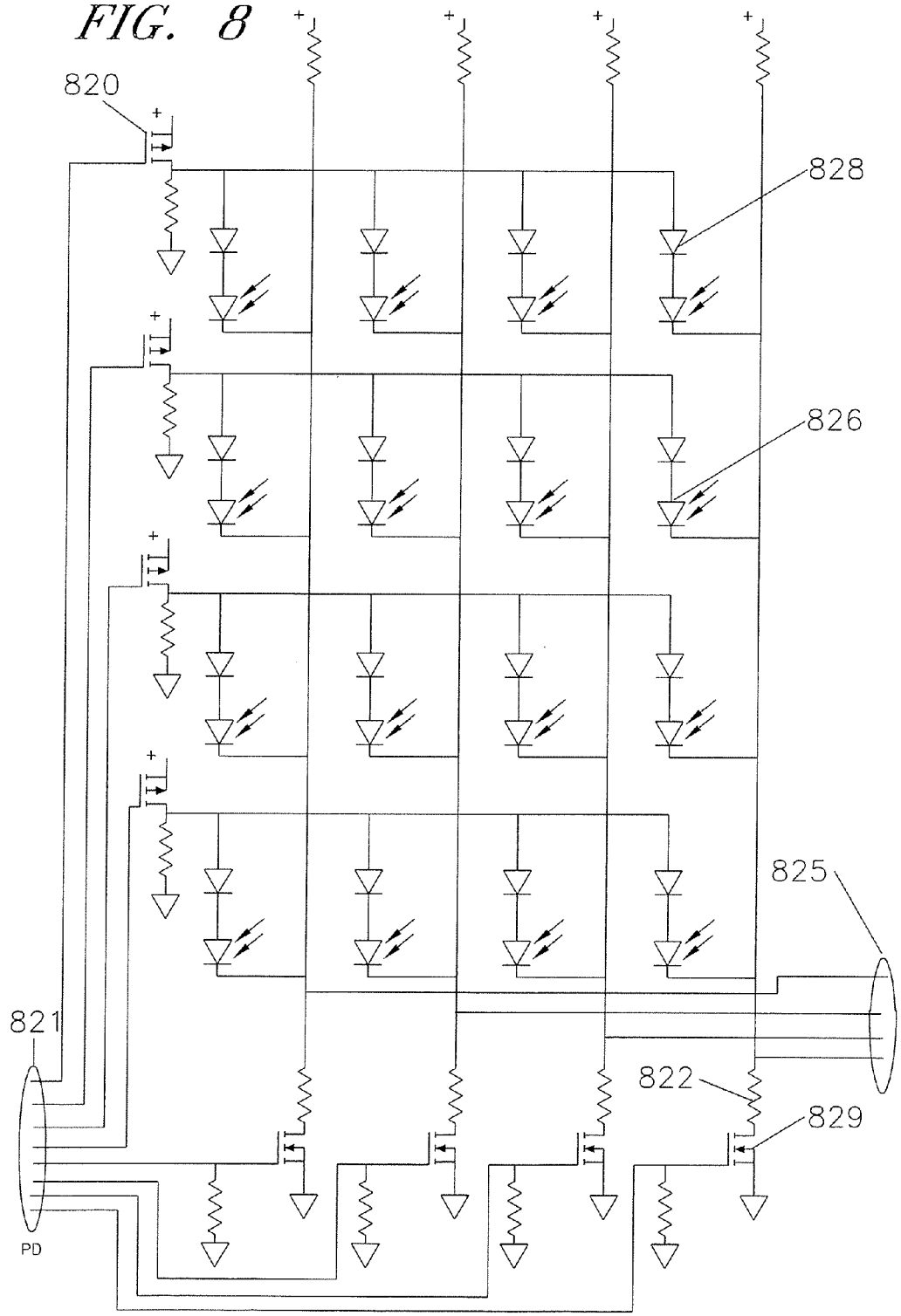
FIG. 8 is a schematic illustrating the detector input section of the keyboard in accordance with the teachings of this invention.

FIG. 6 is a schematic illustrating the microprocessor section of the keyboard with microprocessor 600 connected to and controlling of components like keyboard connector 604 as shown and plus it is controlling the inputs and outputs as shown that it also connected and controls the circuits in FIG. 7 and FIG. 8 via ports like 602.

FIG. 7 is a schematic illustrating the emitter output section of the keyboard being controlled by control inputs 734 and can be for the IR emitters and the LED emitters 732 with current limiting resistor 731 and controlled by PFET 730 and NFET 733, and being in a matrix depending on the amount of key locations the matrix could be made larger or smaller with the timing on and off being controlled by the microprocessor of FIG. 6.

FIG. 8 is a schematic illustrating the IR detector input section of the keyboard and being in a matrix depending on the amount of key locations the matrix could be made larger or smaller and with digital signal processing (DSP) techniques or absolute detection timing is controlled by the microprocessor of FIG. 6. Having input control 821 and analog output lines 825 where the matrix is controlled by PFETS like 820 with blocking diodes 828 and IR detectors 826 being on when NFETS 829 are selected to sense outputs analog outputs over current sense resistors 822 that the IR emitter attenuates the photo diode and this attenuation is seen over the current sense resistor 822.

Figure 9:
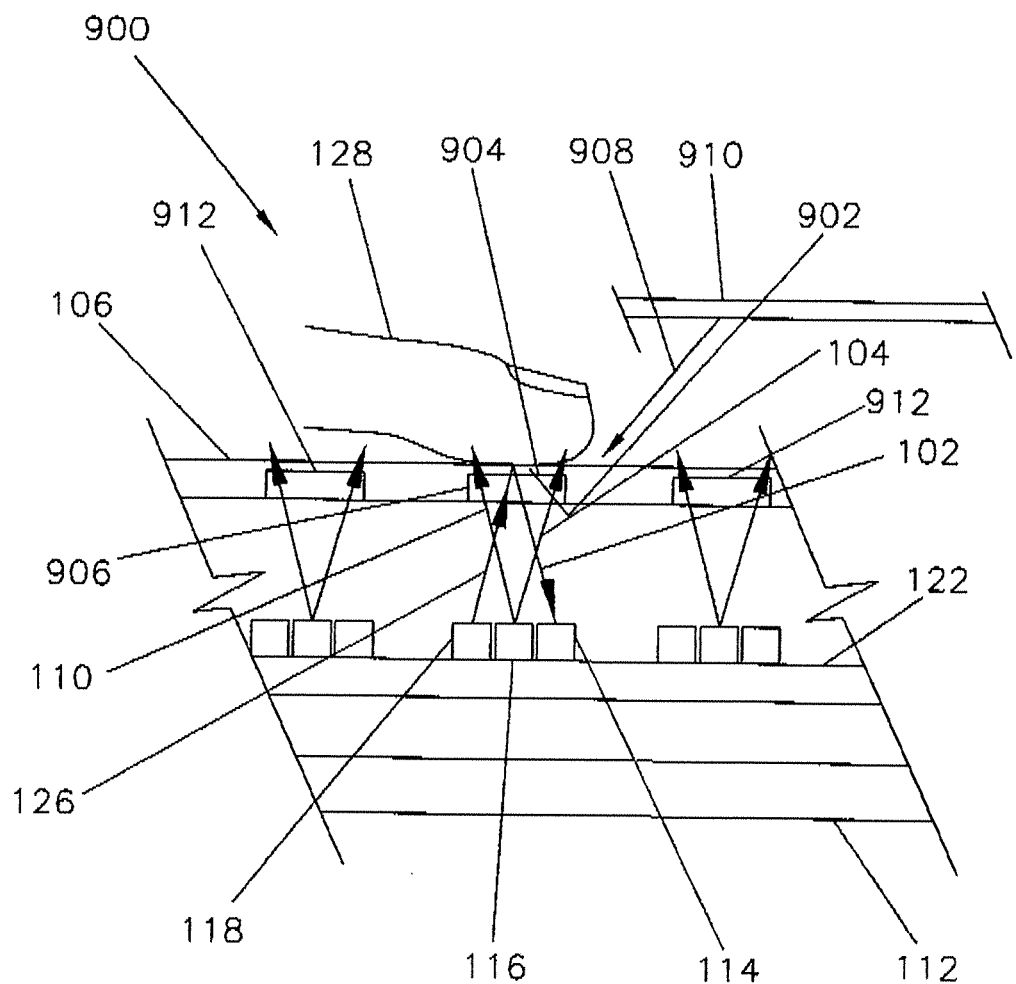
FIG. 9 shows a finger placed on a key location with printed or molded key indicia of a keyboard with plastic top housing having and optional overlay where an emitted light beam reflected off a finger to a detector when a finger is present in accordance with the teachings of this invention.

FIG. 9 is of similar structure of FIGS. 1, 1A and 2 with like item numbers being the same in the FIG's. FIG. 9 shows keyboard 900 with planar top cover 106 having a planar top surface forming the upper housing of keyboard 900 with operators finger 128 placed over substantially transparent area 902 to block ambient light from influencing the output of emitter 118 and reflecting the output beam 126 to photo detector 114 via reflected beam 104. Center LED emitter 116 outputs a beam shown by arrows 110 and 102 to illuminate the key indicia printed on top cover 106 or overlay 910 so a user in low light ambient can see key indicia. Lower housing 112 covers printed wiring board 122 that provide connection circuitry for emitter 118, photo detector 114 and LED emitter 116. Opening 906, like hole 108a in FIG. 1A or opening 208 FIG. 2, having a depth 904 can vary in depth or thickness depending on the transparency of planar top cover 106 from an equal thickness of planar top cover 106 to a through opening 906 in planar top cover 106 where it can be covered by overlay 910 to a position as shown by arrow 908 where overlay 910 is under operators finger 128 and remain planar as planar top cover 106 while covering planar top cover 106 opening 906 to keep contaminates from entering keyboard 900 where overlay 106 then forms the substantially transparent area and maintains no holes or openings in keyboard 900 planar top surface. Key indicia can be placed on planar top cover 106 and covered by overlay 910 protecting it from an operators wear and tear or placed on overlay 910. Locations 912 show a plurality of other key locations that can be on keyboard 900 depending on an application need.

It should be appreciated to those skilled in the art that although the FIG's. herein shows a limited key number that more keys or less keys are only a matter of reducing the size the key matrix or increasing the size of the matrix.

Figure 10:
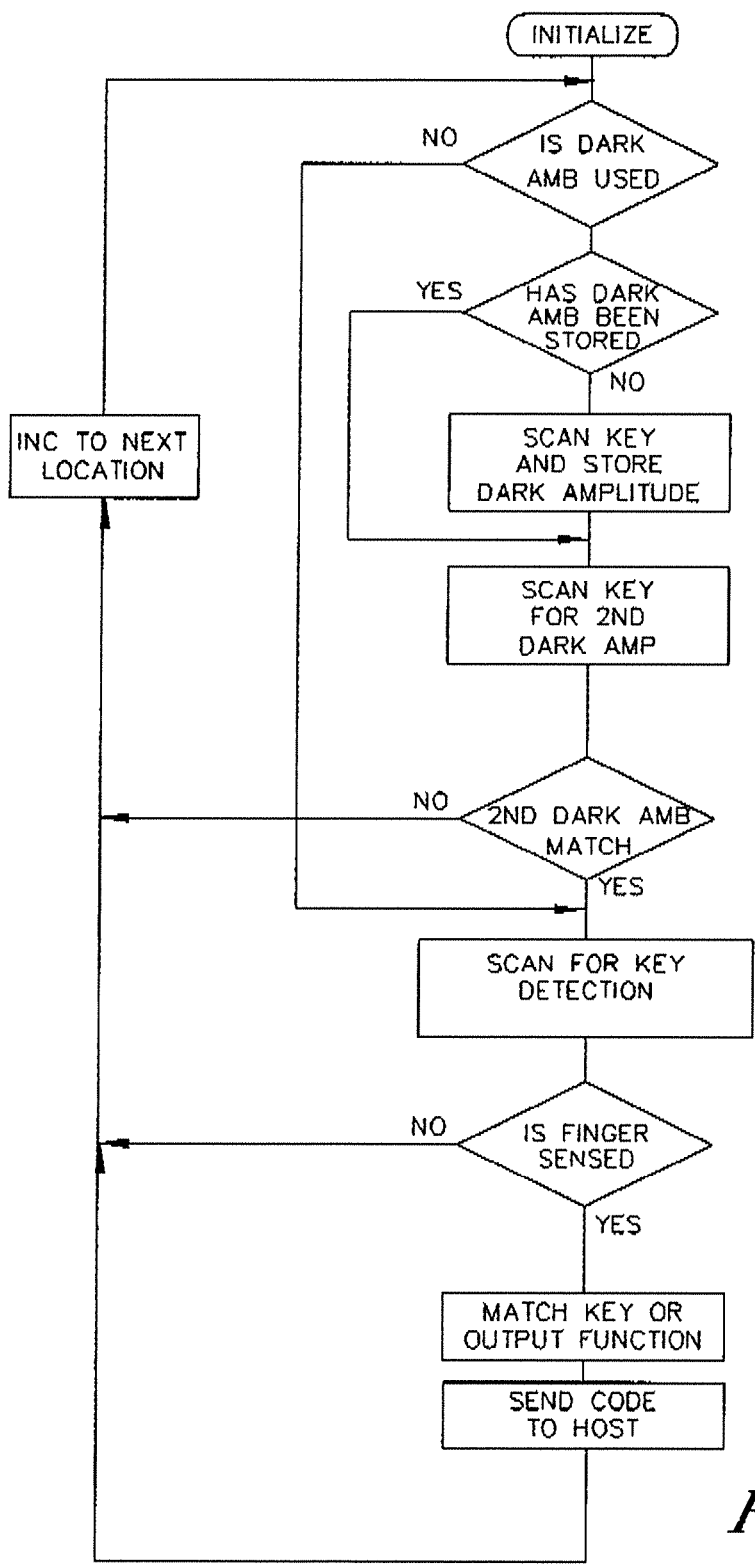
FIG. 10 is a flow chart showing the program in the microprocessor for two ambient detection for controlling the keyboard in accordance with the teachings of this invention.

FIG. 10 is a flow chart showing the program in the microprocessor for controlling the keyboard where at INITIALIZE the processor starts and sets all of the output and input ports to their status and sends start up codes to a host for PS2 or USB, or if connected to some other type of serial host then awaits instructions to start keyboard functions, or continues with PS2 or USB outputs. At IS DARK AMB USED if the keyboard is not going to be used in a dark ambient environment or in bright sunlight then goes on to SCAN FOR KEY DETECTION, if dark ambient is being used a question HAS DARK AMB BEEN STORED if NO the process does SCAN KEY AND STORE DARK AMPLITUDE calibration, where present key is to be stored, YES, the program continues to SCAN KEY FOR 2ND DARK AMB calibration, if the second dark ambient calibration matches first dark ambient calibration stored the program continues to SCAN FOR KEY DETECTION, if NO the program increments to the next key location and starts again. A YES at 2ND DARK AMB MATCH means a users finger has been placed over a key indicia location and blocked the ambient light for a series of at least two subsequent detections and a match or are substantially the same the process continues to SCAN FOR KEY DETECTION, or if at SCAN FOR KEY DETECTION where the resulting from a NO at IS DARK AMB USED, in either case, the IR emitter is turned on to see if a reflectance is seen on the IR detector and that it is substantially different, then go to IS FINGER SENSED and if a reflectance, substantially different, is seen then YES and go to MATCH KEY OR OUTPUT FUNCTION and SEND CODE TO HOST and INC TO NEXT LOCATION and return, or if at IS FINGER SENSED a reflectance is not seen then INC TO NEXT LOCATION and return. If at SCAN FOR KEY DETECTION there is not substantially different at NO the process increments to the next location and starts again. This process is continued until all keys on the keyboard are tested and then the process is started again. It should be understood by those skilled in the art that the keyboard could be any number of keys and not only the amount of keys shown in FIG. 3.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A keyboard with reflected light beam finger detection, comprising:
   a keyboard planar top surface free from openings or microbial harbors;
   key indicia disposed on said top surface of said keyboard;
   said key indicia aligned with at least one substantially transparent area in said top surface;
   at least one light emitter and at least one light detector pair aligned with said at least one substantially transparent area, and below said top surface;
   a microprocessor configured to scan said at least one light detector,
   wherein when a finger is placed over one of said substantially transparent area said at least one detector attenuation changes, and said microprocessor stores a first dark ambient calibration from said finger blocking said keyboard ambient light;
   wherein when at least one detector is scanned and after said microprocessor determines at least one detector of said at least one detector has an attenuation value substantially equal to said first dark ambient calibration an emitter paired with said at least one detector of said at least one detector is turned on to reflect an emitter beam from said at least one emitter to said at least one detector, and
   if said at least one detector has no substantial change in said attenuation, this indication of no substantial change is equated to no finger being detected; and
   if said at least one detector has a substantial change in said attenuation, this said indication of a substantial change is equated to the presence of a finger being detected, and a key code representative of said indicia is transmitted to a host.

2. A keyboard with reflected light beam finger detection as claimed in claim 1 further including
   a diode to emit visible light at each of said at least one substantially transparent areas.

3. A keyboard with reflected light beam finger detection as claimed in claim 1 further including
   an overlay disposed on said keyboard planar top surface.

4. A keyboard with reflected light beam finger detection as claimed in claim 3 further including an embossed ring aligned with each of at least one of said substantially transparent areas protruding up from said overlay.

\* \* \* \* \*